United States Patent [19]
Berger et al.

[11] 3,767,946
[45] Oct. 23, 1973

[54] JUNCTION FIELD EFFECT TRANSISTOR DEVICE FOR REPLACING A PENTODE

[75] Inventors: Robert L. Berger, Raytown; Alwin J. Holt, Jr., Lee Summit, both of Mo.

[73] Assignee: Western Electric Company, Incorporated, New York, N.Y.

[22] Filed: July 17, 1972

[21] Appl. No.: 272,242

[52] U.S. Cl. .................... 307/304, 315/52, 333/80, 330/38
[51] Int. Cl. .................... H03k 3/26
[58] Field of Search .................... 307/304; 315/52; 307/304; 330/38, 18; 331/116; 333/80

[56] References Cited
UNITED STATES PATENTS

| | | | |
|---|---|---|---|
| 2,618,690 | 11/1952 | Stuetzer | 307/304 X |
| 3,531,654 | 9/1970 | Eby | 315/52 X |
| 3,657,568 | 4/1972 | Dargent | 307/304 X |

*Primary Examiner*—John W. Huckert
*Assistant Examiner*—Ro E. Hart
*Attorney*—W. M. Kain et al.

[57] ABSTRACT

A field-effect transistor device for replacing a pentode includes four terminals which correspond to a cathode terminal, a control grid terminal, a screen grid terminal and a plate terminal of the pentode. When placed into an oscillator circuit to replace the pentode, voltage signals appearing at the terminal corresponding to the control grid terminal of the pentode are utilized by a first transistor circuit to provide feedback signals at the terminal which corresponds to the screen grid terminal of the pentode. The same voltage signals are amplified by a second transistor circuit to supply output signals at the terminal corresponding to the plate terminal of the pentode.

7 Claims, 2 Drawing Figures

JUNCTION FIELD EFFECT TRANSISTOR DEVICE FOR REPLACING A PENTODE

BACKGROUND OF THE INVENTION

1. Field of the Invention

This invention relates to a junction-field-effect transistor device and, particularly, to such a device for replacing a pentode vacuum tube in an oscillator circuit.

2. Discussion of the Prior Art

Junction-field-effect transistors have electrical characteristics which are similar to those of pentode vacuum tubes or pentodes. The transistors have cetain advantages over the pentodes. For instance, the transistors operate at a lower power consumption level than the pentodes and, consequently, generate less heat. Furthermore, the electrical characteristics of the transistors are more stable with respect to time than those of the pentodes. The most important advantage, however, appears to be that the transistors have a much longer life span than the pentodes. An article written by Bruce Burman and entitled Vacuum Tubes Yield Sockets to Hybrid JFET Devices in the Apr. 10, 1972 issue of Electronics, amply discusses the advantages of the transistors over the pentodes.

Such a transistor even though it has characteristics similar to those of a pentode has only three terminals. In effect, the transistor lacks an equivalent of the pentode's screen and its corresponding terminal. The lack of the screen terminal equivalent is of no consequence when the transistor is to be used as an amplifier to replace a pentode operating as a triode. In a circuit where a pentode has been operating as a triode, the source, the gate and the drain of the transistor replace the cathode, the control grid and the plate of the pentode in a one-to-one substitution.

A known oscillator circuit, as for instance, a crystal controlled Pierce Oscillator circuit having an oscillator loop and an output loop, employs a pentode as an active oscillator element. In this oscillator circuit, a connection form the screen grid of the pentode conveniently supplies the oscillator loop with a feedback signal to generate an oscillator signal, The oscillator signal, in turn, controls the voltages on the control grid and thereby controls the amount of current flow through the pentode. The transistor lacks the screen connection of the pentode for providing a convenient supply for the feedback signal to drive the oscillator loop of the circuit. Since such feedback signal is required to operate the oscillator circuit, a problem exists when it is intended to replace the pentode as the circuit with one of the transistors.

The above-cited aforementioned article in Electronics magazine describes a particular solution to the problem of not having a terminal for providing a feedback signal. As disclosed in the article, an impendance coupling from the output loop to the oscillator loop supplies the feedback signal to the oscillator loop.

While the described solution is workable, it is also limited in its usefulness. The limitations stem from the added impedance of the coupling which changes the impedance of the feedback loop of the associated oscillator. The changed impedance affects the characteristic frequency response of the oscillator loop. Consequently, the value of the coupling impedance has to be matched to the particular operating frequency of an oscillator circuit at which the transistor is to be operated.

The requirement for matching the impedance in a transistor circuit to a particular oscillator results in a great number of transistor circuit variations. These variations are distinguished from each other by the presence of impedances of different values. The need for various types of transistor circuits having special and limited applicability to replace a single type of pentode affects the usefulness of a transistor replacement for pentode tubes.

It is desirable to replace pentodes in oscillator circuits by transistor devices without having to match coupling impedances to particular operating frequencies of the oscillator circuits.

SUMMARY OF THE INVENTION

It is, therefore, an object of the invention to provide a junction-field-effect transistor device for replacing a pentode vacuum tube in an oscillator circuit without regard for the design frequency of the oscillator circuit.

Another object of the invention is to provide a transistor device for direct replacement of a pentode in an oscillator circuit.

In accordance with the objects of this invention, a transistor device includes first and second junction-field-effect transistor circuits, each having a source, a gate and a drain termination. The source terminations of the circuits are coupled to each other, and the gates of the circuits are coupled to each other. Also, provisions are made for connecting each of the coupled source terminations, the coupled gate terminations, the drain terminations of the first and the second circuits to a ground terminal, to a signal voltage terminal to a positively biased output loop terminal and to a positively biased feedback terminal of an external electrical circuit, respectively.

BRIEF DESCRIPTION OF THE DRAWING

The detailed description of a preferred embodiment of the invention will be better understood when reference is made to the accompanying drawing wherein.

DETAILED DESCRIPTION OF THE INVENTION

Figure 1:
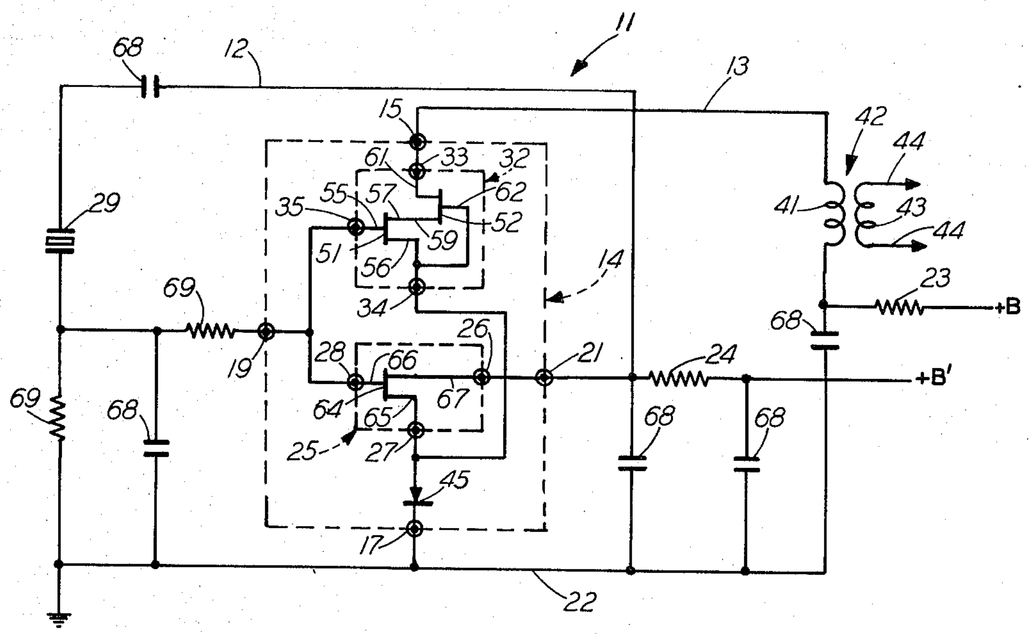
FIG. 1 is a schematic diagram of an oscillator circuit including a transistor circuit for amplifying an output signal of an oscillator loop and for providing a feedback signal separate from the output signal in accordance with the present invention.

Referring now to FIG. 1, an oscillator circuit, designated generally by numeral 11, is shown. The circuit 11 includes an oscillator loop 12 and an output loop 13. A junction field-effect transistor device, designated generally by numeral 14, functions as an active element of both loops of the circuit 11.

In accordance with the invention the transistor device 14 includes four terminals: a drain terminal 15, a source terminal 17, a gate terminal 19 and a feedback terminal 21.

The drain terminal 15 is positively biased. The source terminal 17 is coupled to a ground lead 22 of the circuit 11. The ground lead 22 also provides ground for the output loop 13. In the following description any mention of a voltage without reference to a datum is made in reference to the voltage in the ground lead 22.

The gate terminal 19 receives oscillating voltage signals from the oscillator loop 12, while the feedback terminal 21 delivers a feedback signal to the oscillator loop 12, to sustain the oscillations therein.

A current path through the transistor device 14 between the drain terminal 15 and the source terminal 17 completes the output loop 13. A direct-current bias voltage is provided at the drain terminal 15 in a conventional manner from a battery designated +B through an input resistor 23. Consequently, the voltage at the drain terminal 15 varies between a relatively higher and a lower value depending upon the amount of current passing through the circuit 14 between the terminals 15 and 17.

An unrestricted flow of current between the terminals 15 and 17 lowers the voltage at the drain terminal 15 substantially to ground. On the other hand, when the path between the terminals 15 and 17 is non-conducting or open, the voltage at the drain terminal 15 increases to that of the applied bias voltage. Any current flow less than an unrestricted flow between the terminals 15 and 17 results, of course, in a voltage that lies somewhere between the applied bias voltage and ground.

Another current path through the device 14 between the feedback terminal 21 and the source terminal 17 completes the oscillator loop 12. Again, a direct-current bias voltage is provided in a conventional manner from a battery designated +B′ through a resistor 24 to the feedback terminal 21. The voltage at the feedback terminal 21 varies similarly to the variation of the voltage at the drain terminal 15 in relation to a current flow into the feedback terminal 21 toward the source terminal 17.

Variations of the current flow into the feedback terminal 21 and resulting changes in voltage at the terminal 21 are controlled by a first or feedback transistor circuit designated generally by numeral 25. This circuit 25 is traced through a drain termination 26 which is coupled to the feedback terminal 21 and a source termination 27 which is coupled to the source terminal 17. Such circuit 25 is in series with the path between the terminals 17 and 21.

A gate termination 28 of the circuit 25 is connected to the gate terminal 19 and receives a voltage signal applied to the gate terminal 19 from the oscillator loop. In normal operation of the circuit 25, an increase or a decrease in voltage at the gate termination 28 results in a corresponding increase or decrease in current flow from the feedback terminal 21 to the source terminal 17. Such a controlled increase or decrease in current flow between the terminals 21 and 17 causes a corresponding controlled increase or decrease in voltage at the feedback terminal 21.

In operation, a positive-going voltage signal applied to the gate terminal 19 increases the voltage at the gate termination 28. The increasing voltage results in an increasing current flow from the feedback terminal 21 through the source terminal 17 to the ground lead 22. The current flow causes a voltage drop at the feedback terminal 21. This voltage drop is fed back to the oscillator loop 12 as a decreasing voltage signal.

A major element in controlling the frequency of oscillations is a crystal 29 which tends to vibrate at its natural mechanical frequency, and, in doing so, generates oscillating voltages at the natural frequency of the crystal. In order to continue to vibrate and to generate oscillating voltage signals in accordance with these vibrations, the crystal 29 requires an oscillating input to excite such vibrations. The feedback signal provides such voltage signal to the crystal. Thus, the crystal 29 continues to generate oscillating voltages in the loop 12. The voltage at the gate terminal 19 alternately increases and decreases to provide an oscillating feedback signal at the feedback terminal 21.

A second or output transistor circuit 32 controls the current flow in the current path between the drain terminal 15 and the source terminal 17. A drain terminal 33 of the circuit 32 is coupled to the drain terminal 15 and a source termination 34 is coupled to the source terminal 17 to connect the circuit 32 in series with the path between the terminals 15 and 17.

The current flow between the terminations 33 and 34 varies in response to an increase or decrease of a voltage at a gate termination 35 of the circuit 32. A voltage increase over a previous voltage at the gate termination 35 results in an increased current flow through the circuit 32 and consequently in an increased current flow from the drain terminal 15 to the source terminal 17. A decrease of the voltage at the gate termination 35 reduces the current flow between the terminals 15 and 17.

The gate termination 35 of the circuit 32 is coupled to the gate terminal 19. Thus, a voltage signal from the oscillator loop 12 affects the current flow between the terminals 15 and 17 and thereby controls the voltage in the output loop 13.

There is substantially no feedback from the output loop 16 to affect the feedback signal applied to the oscillator loop 12 at the feedback terminal 21. The oscillator loop 12 operates independently of any currents in the output loop, while the output loop 13 oscillates as a slave to the oscillating voltage signals in the oscillator loop 12.

A primary coil 41 of a transformer 42 is located in the in the output loop 13. The primary coil 41 drives a secondary coil 43 located in a signal line 44 to transfer oscillatory signals from the output loop 13 to the signal line 44 at the frequency of the oscillator loop 12.

Because of the substantially complete absence of feedback from the output loop 13 to the oscillator loop 12, an electrical loading of the signal line 44 affects the current flow in the output loop 13 but does not alter the frequency of oscillations in the oscillator loop 13.

A forward biased diode 45 coupled into the transistor circuit 14 between the source terminations 27 and 34 and the source terminal 17, prevents an accidental current flow from the source terminal 17 to the drain and feedback terminals 15 and 21 of the transistor circuit 14. Furthermore, the diode 45, acting as an impedance, provides a direct current bias voltage between the source terminations 27 and 34 and the gate terminal 19 to improve start-up characteristics of the oscillator circuit 11. Instead of the diode 45, a resistor, by-passed by a capacitor may be used, particularly when a source-drain current reversal is not anticipated or harmful.

In FIG. 1 the output transistor circuit 32 is shown as being a cascoded circuit including a first junction field-effect transistor or control transistor 51 and a second junction field-effect transistor or high voltage transistor 52. In the circuit 32 a gate 55 of the transistor 51 is coupled to the gate termination 35 and a source 56 is coupled to the source termination 34.

To protect the control transistor from a high voltage at the drain termination 33, the high voltage transistor 52 is coupled in series between a drain 57 of the control transistor 51 and the drain termination 33 of the circuit 32. A source 59 and a drain 61 of the high voltage transistor 52 coupled to the drain 57 and the termination 33, respectively, provide a current path between the termination 33 and the drain 57 of the control transistor 51.

Coupling a gate 62 of the high voltage transistor 52 to the source 56 of the control transistor 51 limits the maximum voltage differential between the drain 57 and the source 56 of the control transistor 51 to the pinch-off voltage of the high voltage transistor 52. By cascoding the transistors 51 and 52 it becomes possible for the high voltage transistor 52 to shield the control transistor 51 from high voltages in excess of the pinch-off voltage of the high voltage transistor which may appear at the drain termination 33. The control transistor 51, nevertheless, controls the current flow through the circuit 32 in response to the voltage signals at the gate termination 35.

The feedback transistor circuit 25 in FIG. 1 is comprised of a sole junction filed-effect transistor 64. Because the maximum bias voltage to be applied to the drain termination 26 of the circuit 25 is presumed to be less than the breakdown voltage of the transistor 64, a shielding high voltage transistor similar to the transistor 52 is not needed in the circuit 25. The transistor 64, therefore, has a source 65, a gate 66 and a drain 67 connected to the terminations 27, 28 and 26, respectively, to complete the circuit 25.

It is possible, however, to use a cascoded circuit arrangement, similar to the arrangement of the output transistor circuit 32, in place of the transistor 64 in the feedback transistor circuit 25. Also, in circuits where bias voltages do not exceed the breakdown voltages of the transistors used in the transistor device 14, cascoding of transistors may be dispensed with entirely.

Other elements in the oscillator circuit 11, such as capacitors 68 and resistors 69, are bias elements of the particular circuit 11. The values and characteristics of these bias elements 68 and 69 are determined according to well known circuit design techniques.

Figure 2:
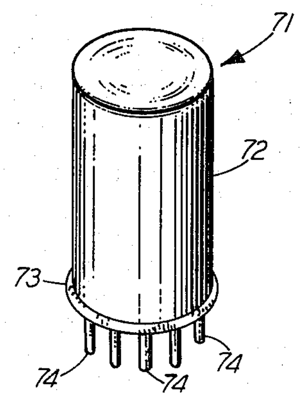
FIG. 2 is a pictorial representation of an encapsulated transistor circuit device according to the present invention, showing typical electrical connections to fit into a pentode socket as a replacement for such pentode.

FIG. 2 shows a preferred package for the transistor device 14 which is designated generally by numeral 71. A protective can 72 is mounted to a base 73. The base 73 supports a plurality of circuit connector pins 74. The size and the arrangement of these pins 74 preferably duplicate the standard size and the arrangement of pentode vacuum tubes which are to be replaced by the device 14. The device 14 (not shown in FIG. 2) is mounted inside the protective can 72 in any one of a number of conventional ways. Preferably, the base 73 has a ceramic header portion (not shown) onto which the device 14 is mounted or bonded in a conventional manner.

In the package 71, the transistor device 14 connects to selected pins 74. These pins 74, in turn, couple the transistor device 14 to an external circuit to complete an oscillator circuit such as the circuit 11.

In connecting the transistor device 14 to the pins 74, the source terminal 17, the gate terminal 19, the drain terminal 15 and the feedback terminal 21 are connected to predetermined ones of the pins 74 which correspond to a cathode pin, a control grid pin, a plate pin and a screen grid pin of a pentode, respectively.

Even though the tansistor device 14 has been described in particular with cascoded transistors in the output loop 13, a single transistor in the oscillator loop 12 and with respect to a particular oscillator circuit 11, it must be understood that this description is merely illustrative. Modifications and substitutions can be made to the transistor device 14 without affecting the scope or spirit of the invention.

What is cliamed is:

1. A field-effect transistor device for replacing a vacuum tube having at least a cathode, a control grid, a plate, and a screen grid, the device comprising:

a first and a second field-effect transistor circuit, each having a source termination, a gate termination and a drain termination, the source termination of the first circuit being coupled to the source termination of the second circuit and the gate termination of the first circuit being coupled to the gate termination of the second circuit; and means, corresponding to cathode, control gird, plate and screen grid connections of the vacuum tube for connecting the coupled source terminations, the coupled gate terminations, the drain termination of the first circuit and the drain termination of the second circuit to a ground terminal, to a signal voltage terminal, to a positively biased output loop terminal and to a positively biased signal feedback terminal of an external electric circuit, respectively.

2. A device according to claim 1 wherein at least one of the field-effect transistor circuits is a cascoded circuit comprising:

a first field-effect transtor having a source, a gate and a drain, the source of the first transistor being coupled to the source termination of the cascoded circuit and the gate of the first transistor being coupled to the gate termination of the cascoded circuit; and a second field effect transistor having a source, a gate and a drain, the source of the second transistor being coupled to the drain of the first transistor, the gate of the second transistor being coupled to the source of the first transistor and the drain of the second transistor being coupled to the drain termination of the cascoded circuit.

3. A device according to claim 1 further comprising an impedance coupled between the sources of the transistor circuits and the ground terminal of the external electric circuit.

4. A device according to claim 3 wherein the impedance is a normally forward biased diode.

5. A field-effect transistor circuit for replacing the function of a pentode vacuum tube in an oscillator circuit having an oscillator loop, a feedback loop and a common ground return for each loop, the transistor circuit comprising:

a first and a second field-effect transistor each having a source, a gate and a drain, the source of the first transistor being coupled to the gate of the second transistor and the drain of the first transistor being coupled to the source of the second transistor;

a third field-effect transistor having a source, a gate and a drain, the source of the third transistor being coupled to the source of the first transistor, and the gate of the third transistor being coupled to the gate of the first transistor; and means for coupling the source of the first transistor to the common ground return for each loop, the gate of the first transistor to a terminal in the oscillator loop to receive oscillating voltage signals, the drain of the second transistor to a positively biased point of the output loop and the drain of the third transistor to a positively biased point of the oscillator loop in the oscillator circuit.

6. A field-effect transistor device for replacing a vacuum tube in a circuit, which comprises:

a base;

a cathode pin, a control grid pin, a screen grid pin and a plate pin geometrically mounted in the base to correspond to similar positions of contact pins of the tube;

the first field-effect transistor having a source, a gate and a drain mounted with respect to the base, the gate of such first transistor being coupled to the control grid pin;

a second field-effect transistor having a source, a gate and a drain mounted with respect to the base, the source of the second transistor being coupled to the drain of the first transistor, the gate of the second transistor being coupled to the source of the first transistor and the drain of the second transistor being coupled to the plate pin;

a third field-effect transistor having a source, a gate and a drain mounted with respect to the base, the source of the third transistor being coupled to the source of the first transistor, the gate of the third transistor being coupled to the control grid pin and the drain of the third transistor being coupled to the screen grid pin; and an impedance coupled between the sources of the first and third transistors and the cathode pin.

7. A device according to claim 6 wherein the impedance comprises a forward biased diode.

* * * * *

L-566-PT
(6-69)

UNITED STATES PATENT OFFICE
CERTIFICATE OF CORRECTION

Patent No. 3,767,946 Dated October 23, 1973

Inventor(s) R. L. BERGER-A. J. HOLT, JR.

It is certified that error appears in the above-identified patent and that said Letters Patent are hereby corrected as shown below:

Col. 1, line 5 (Spec. p. 1, line 2) "1." should be omitted;

line 9 (Spec. p. 1, line 6) "2." should be omitted;

line 41 (Spec. p. 2, line 2) "form" should be --from--;

line 56 (Spec. p. 2, line 16) "impendance" should be --impedance--.

Col. 6, claim 2, line 34, "transtor" should be --transistor--.

Signed and sealed this 4th day of June 1974.

(SEAL)
Attest:

EDWARD M. FLETCHER, JR.
Attesting Officer

C. MARSHALL DANN
Commissioner of Patents